United States Patent
Shimizu

[19]
[11] Patent Number: 5,960,142
[45] Date of Patent: Sep. 28, 1999

[54] PELTIER COOLER AND SEMICONDUCTOR LASER MODULE USING PELTIER COOLER

[75] Inventor: Haruhito Shimizu, Tokyo, Japan

[73] Assignee: NEC Corporation, Tokyo, Japan

[21] Appl. No.: 08/909,661

[22] Filed: Aug. 12, 1997

[30] Foreign Application Priority Data

Aug. 13, 1996 [JP] Japan .................................. 8-213507

[51] Int. Cl.⁶ .................................................. G02B 6/42
[52] U.S. Cl. ............................................. 385/92; 372/34
[58] Field of Search ........................ 250/227.11; 372/34, 372/37; 385/93, 88, 92

[56] References Cited

U.S. PATENT DOCUMENTS

| | | | |
|---|---|---|---|
| 4,803,689 | 2/1989 | Shibanuma | 372/36 |
| 4,920,262 | 4/1990 | Aiki et al. | 250/227.11 |
| 5,068,865 | 11/1991 | Ohshima et al. | 372/36 |
| 5,212,699 | 5/1993 | Masuko et al. | 372/34 |
| 5,214,660 | 5/1993 | Masuko et al. | 372/34 |
| 5,216,737 | 6/1993 | Driessen et al. | 385/93 |
| 5,233,622 | 8/1993 | Iwamoto | 372/34 |
| 5,247,530 | 9/1993 | Shigeno et al. | 372/36 |
| 5,341,388 | 8/1994 | Masuda et al. | 372/36 |
| 5,381,499 | 1/1995 | Kakenaka et al. | 385/93 |
| 5,703,893 | 12/1997 | Komiyama et al. | 372/43 |
| 5,706,302 | 1/1998 | Shimizu | 372/36 |
| 5,712,940 | 1/1998 | Van Roemburg et al. | 385/93 |
| 5,737,349 | 4/1998 | Gaebe | 372/37 |

FOREIGN PATENT DOCUMENTS

| | | |
|---|---|---|
| 0 326 207 | 8/1989 | European Pat. Off. . |
| 62-144124 | 6/1987 | Japan . |
| 62-276892 | 12/1987 | Japan . |
| 1-220491 | 9/1989 | Japan . |
| 1-243488 | 9/1989 | Japan . |
| 401243488 | 9/1989 | Japan . |
| 2-66987 | 3/1990 | Japan . |
| 2-247093 | 10/1990 | Japan . |
| 4-218989 | 8/1992 | Japan . |
| 4-243181 | 8/1992 | Japan . |
| 4-343492 | 11/1992 | Japan . |
| 4-355706 | 12/1992 | Japan . |
| 405299777 | 11/1993 | Japan . |
| 5-327031 | 12/1993 | Japan . |
| 8-250796 | 9/1996 | Japan . |
| 409275244 | 10/1997 | Japan . |

OTHER PUBLICATIONS

By S. Kaneko et al., "Small Size Array LD Module for Optical FDM Transmission Systems", *Autumn Convention for the Electronics, Information and Communications Society*, 1993.

*Primary Examiner*—Rodney Bovernick
*Assistant Examiner*—Juliana K. Kang
*Attorney, Agent, or Firm*—Young & Thompson

[57] ABSTRACT

A Peltier cooler (12) according to the present invention has a structure in which a Peltier device (12c) is put between a low temperature side substrate part (12a) and a high temperature side substrate part (12b) both made of insulating material. A first metal frame (22a) and a second metal frame (22b) are solder-fixed to the edge portions of the insulating substrates, respectively. The first and second metal frames (22a) and (22b) can be fixed highly precisely and stably by means of laser welding. By so doing, no solder creep occurs on the semiconductor laser module, thereby ensuring the stable arrangement of the optical system for a long time.

2 Claims, 5 Drawing Sheets

PELTIER COOLER AND SEMICONDUCTOR LASER MODULE USING PELTIER COOLER

BACKGROUND OF THE INVENTION

1. Field of the Invention

The present invention relates to a Peltier cooler serving as an electronics cooling device and to a semiconductor laser module using the Peltier cooler.

2. Description of the Related Art

A semiconductor laser module is used to convert an electric signal to an optical signal in, for example, an optical fiber transmission. By driving a semiconductor laser device provided within the semiconductor laser module by an electric signal, a modulated signal light is obtained. Since the oscillation wavelength and optical output of the semiconductor laser has a temperature dependency characteristics, it is required to control the temperature of the semiconductor laser to ensure stable operation. To this end, a semiconductor laser module including a Peltier cooler serving as an electronics cooling device has been developed.

As an example of the laser module including the Peltier cooler, a module disclosed in the lecture theses C-180 of the Autumn Convention for the Electronics, Information and Communications Society in 1993 is known.

The module disclosed therein, however, has a problem that creep tends to occur in a fixed portion using a low temperature solder and that the optical system cannot be maintained in an optimum state for a long time.

To solve this problem, Japanese Patent Application Unexamined Publication No. 2-66987 discloses a semiconductor laser module wherein a cooling device is provided in a module package and a cylindrical laser unit having such characteristics that the optical axis is less shifted by changes in outside temperature, is fixed by a solder. Important elements of the optical module are provided in this cylindrical laser unit, thereby disregarding time series shifts in the optical axis.

According to the above-described conventional semiconductor laser module, a cylindrical laser unit is housed in the module and the shape of the module is thereby limited. As a result, the conventional module has disadvantages in that it is difficult to have versatility, manufacturing costs are increased and that the structure becomes complex.

According to a semiconductor laser module disclosed in Japanese Patent Application Unexamined Publication No. 1-220491, a Peltier cooler is provided between a laser module having a semiconductor laser, optical components and the like mounted on a carrier substrate, and the inner base of the module package. According to a semiconductor laser module disclosed in Japanese Patent Application Unexamined Publication No. 1-86260, a module package has double bases, a laser unit is fixed on the upper base and a Peltier cooler is fixed on the lower base. In the latter case, too, the above-mentioned problem remains unsolved since the laser unit and the Peltier cooler are fixed by a low temperature solder.

Meanwhile, according to a semiconductor laser module disclosed in Japanese Patent Application Unexamined Publication No. 4-355706, a metal pattern is formed on an upper surface insulating board to thereby fix a semiconductor laser, optical components and the like by means of YAG laser. However, in this case, it is necessary to fix the components while aligning the optical axis on the insulating board within a module package, which is quite different from the original laser unit manufacturing assembly. As a result, a lot of constraints arise.

SUMMARY OF THE INVENTION

The present invention has been made to solve the above-described conventional problems. It is therefore an object of the present invention to provide a Peltier cooler enabling high precision YAG laser weld-fixing while using a laser unit provided on a usual carrier substrate, and to provide also a semiconductor laser module using the Peltier cooler.

To obtain the above object, a Peltier cooler according to the present invention has a Peltier device put between two insulating boards to which metal frames are fixed.

Thus the Peltier cooler can be weld-fixed using metal frames.

In the Peltier cooler according to the present invention, the metal frames have thin through weld parts through which laser can pass.

If laser cannot pass through weld parts, the laser is required to be radiated in a slant direction, and thus the dimension of the module package needs to have an allowance. However, according to the present invention having the above arrangement, since thin weld parts through which laser can pass are provided, laser can be radiated in a perpendicular direction.

A semiconductor laser module according to the present invention comprises a semiconductor laser and an optical component which are mounted on a carrier substrate; a Peltier cooler having a Peltier device put between upper and lower insulating boards and having a metal frame fixed to each of the upper and lower insulating boards; and a module package fixing the carrier substrate to the upper metal frame of the Peltier cooler, fixing the lower metal frame of the Peltier cooler on an inner base of the module package and conducting oscillation light from the laser module to an outside of the module package.

Such an arrangement wherein metal frames are fixed to two insulating boards between which a Peltier device is put makes possible weld-fixing using metal frames which are not made of insulating material such as ceramic.

BRIEF DESCRIPTION OF THE DRAWINGS

The above and other objects, features and advantages of the present invention will become apparent from the following detailed description when taken with the accompanying drawings wherein.

In the drawings, identical reference numerals denote identical devices.

DETAILED DESCRIPTION OF THE PREFERRED EMBODIMENTS

Figure 1:
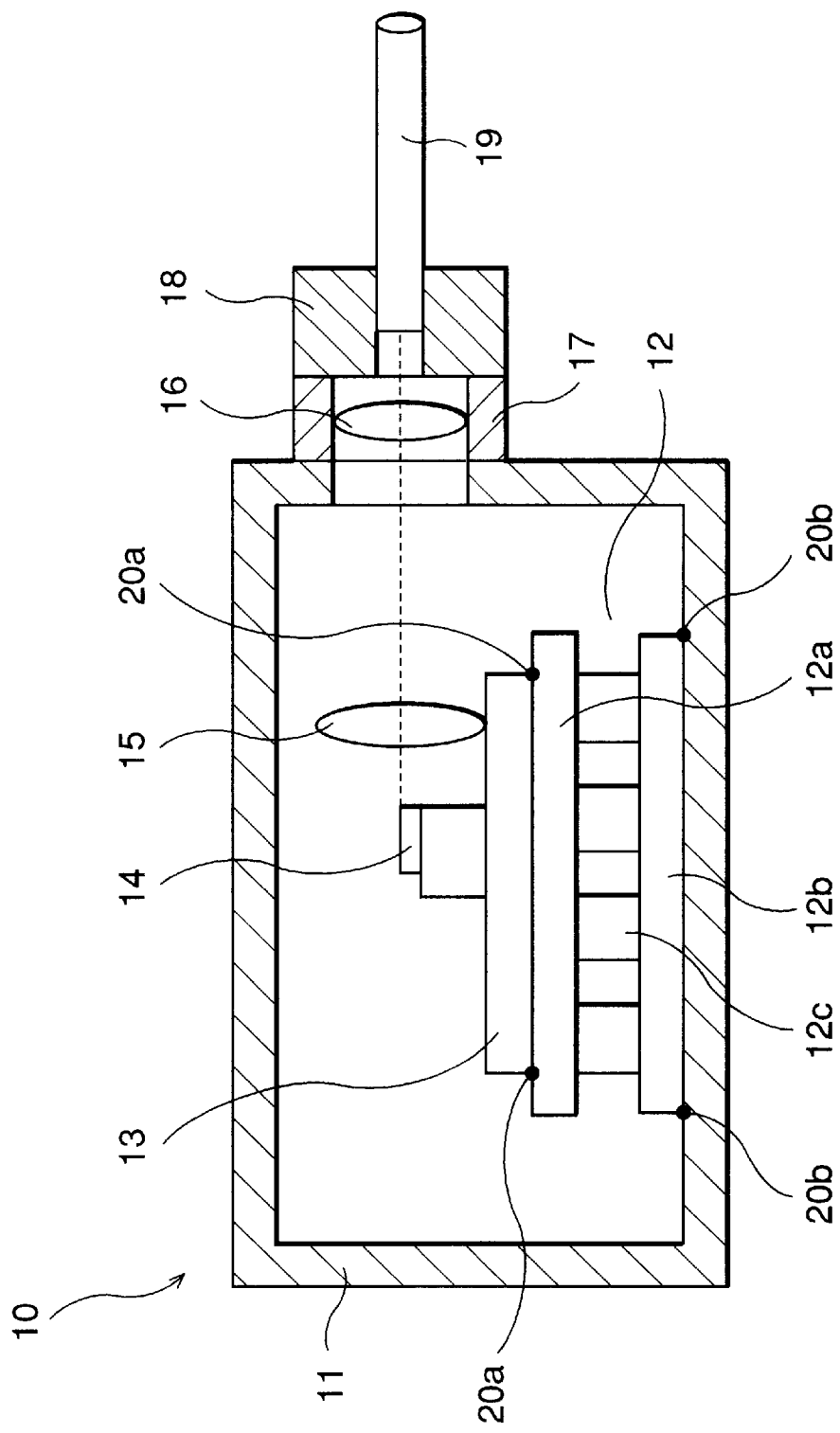
FIG. 1 is a schematic cross-sectional view of a semiconductor laser module in an embodiment according to the present invention.

FIG. 1 is a schematic cross-sectional view of a semiconductor laser module in an embodiment according to the present invention.

In FIG. 1, a rectangular box-type module package 11 of a semiconductor laser module 10 is made of FeNiCo alloy and includes a carrier substrate 13 and a Peltier cooler 12. The Peltier cooler 12 is arranged on the inner base of the module package 11 and the carrier substrate 13 is arranged on the upper surface of the Peltier cooler 12.

In this embodiment, the module package 11 is rectangular box shaped and made of FeNiCo alloy. However, the shape of the package 11 can be freely chosen as long as the package 11 can house the Peltier cooler 12 and the laser unit. Moreover, the Peltier cooler 12 is arranged on the inner base of the module package 11 in this embodiment. However, it is not necessarily arranged on the base and the vertical and horizontal directions of the cooler 12 to be described hereinafter are nothing but relative directions.

The carrier substrate 13 is made of FeNiCo alloy. A semiconductor laser device 14 and a first lens unit 15 are mounted on the carrier substrate 13. A second lens 16 is provided outside the module package 11 in a cylindrical member 17 in the extended direction of the optical axis of the first lens unit 15. One end of an optical fiber 19 is inserted into a cap 18 of the cylindrical member 17 so as to align the optical fiber 19 with the optical axis of the first lens unit 15.

With the above-described arrangement, a laser beam emitted from the semiconductor laser device 14 is converted into a collimated beam by the first lens unit 15. The collimated beam is then focused by the second lens 16 and thereby coupled with the optical fiber 19.

It is noted here that a thermister (not shown) serving as a temperature detection device is provided on the carrier substrate to detect the temperature of the semiconductor laser device 14. The current of the Peltier cooler 12 is controlled so that the detected temperature becomes coincident with the predetermined temperature. Such current control provides the temperature of the semiconductor laser device 14 to be almost constant irrespectively of changes in the ambient temperature.

Moreover, positions of the first lens unit 15, the second lens 16 and the optical fiber 19 are adjusted and fixed so that the efficiency of the coupling between the semiconductor laser device 14 and the optical fiber 19 becomes a maximum.

In this embodiment, the optical system of the laser beam consists of the first lens unit 15 and the second lens 16. It is of course possible to modify the structure appropriately. Further, the outgoing direction of the laser beam should not be limited to that shown in the embodiment FIG. 1 and can be changed appropriately.

The Peltier cooler 12 consists of a low temperature side substrate part 12a, a high temperature side substrate part 12b and a Peltier device 12c put between the substrate parts 12a and 12b.

Figure 2:
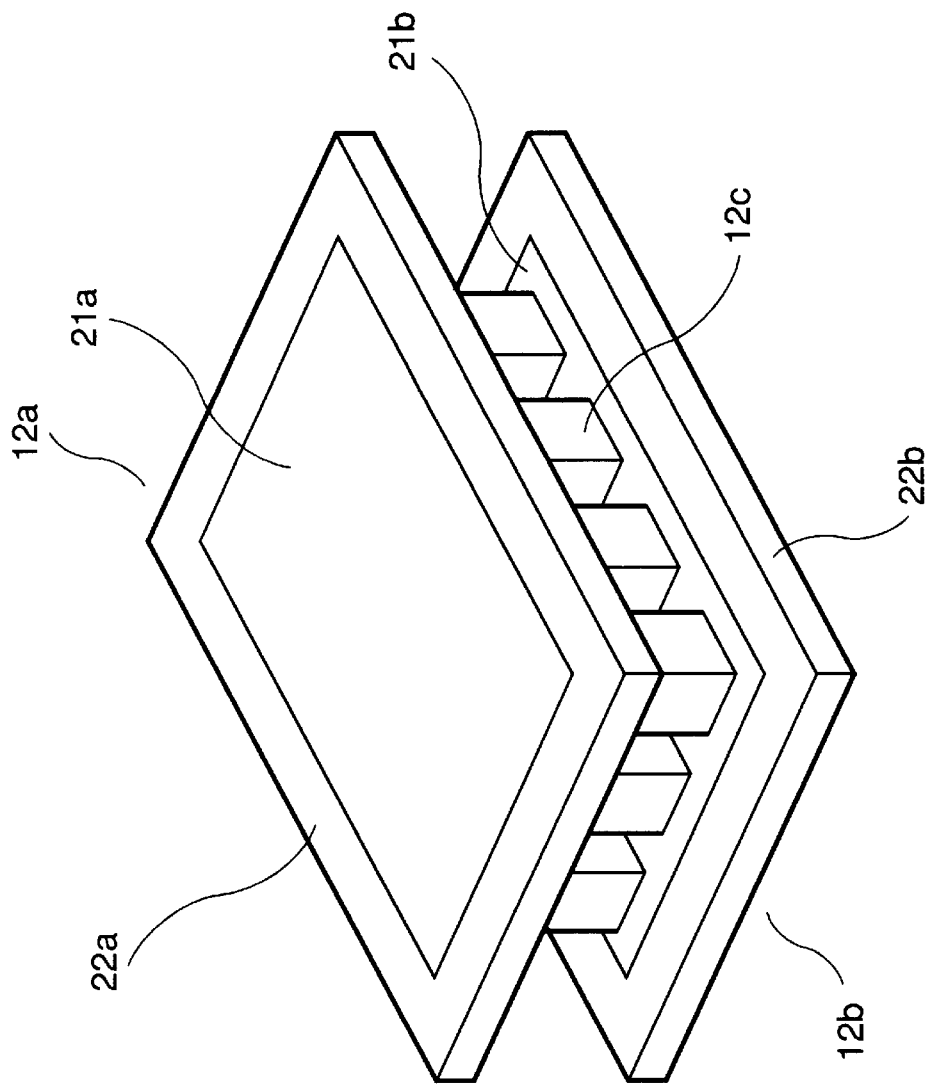
FIG. 2 is a perspective view of a Peltier cooler of the semiconductor laser module of FIG. 1.

FIG. 2 is a perspective view of the Peltier cooler 12.

The low temperature side substrate part 12a consists of a first ceramic substrate 21a connected to the Peltier device 12c and a first metal frame 22a solder-fixed on the outer periphery of the first ceramic substrate 21a.

Likewise, the high temperature side substrate part 12b consists of a second ceramic substrate 21b connected to the Peltier device 12c and a second metal frame 22b solder-fixed on the outer periphery of the second ceramic substrate 21b.

A lead, which is not shown, is connected to the Peltier device 12c. Current is supplied to the Peltier device 12c from outside of the module through the lead.

Here, the first and second ceramic substrates 21a and 21b are made of alumina. The first and second metal frames 22a and 22b are made of FeNiCo alloy. The soldering between the first ceramic substrate 21a and the first metal frame 22a and that between the second ceramic substrate 21b and the second metal frame 22b are made by using AgCu.

The metal frames 22a and 22b are not necessarily of continuous annular shape. The shape may be freely chosen as long as their peripheral portions can be fixedly welded.

In this embodiment, the first and second ceramic substrates 21a and 21b serve as insulating substrates made of alumina. However, the material may be freely chosen as long as they are made of insulating material and it is possible to make a ceramic substrate out of, for example, AlN. Furthermore, the first ceramic substrate 21a and the first metal frame 22a, and the second ceramic substrate 21b and the second metal frame 22b are solder-fixed by using AgCu, respectively. However, other alloys such as AuGe can be used as long as they can be fixed.

Now, installation method of this embodiment having the above-described arrangement will be described.

The first metal frame 22a of the Peltier cooler 12 and the carrier substrate 13 are fixedly welded at a weld part 20a shown in FIG. 1 by means of high-precision YAG laser. Likewise, the second metal frame 22b of the Peltier cooler 12 and the inner base of the module package 11 are fixedly welded at a weld part 20b shown in FIG. 1 by means of high-precision YAG laser.

As can be seen from the above, the semiconductor laser module 10 using the Peltier cooler illustrated in this embodiment makes it possible to fix the Peltier cooler and the carrier substrate not by conventional low temperature soldering but by means of YAG laser welding. As a result, no solder creep occurs, thereby ensuring the stable arrangement of the optical system for a long time.

Figure 3:
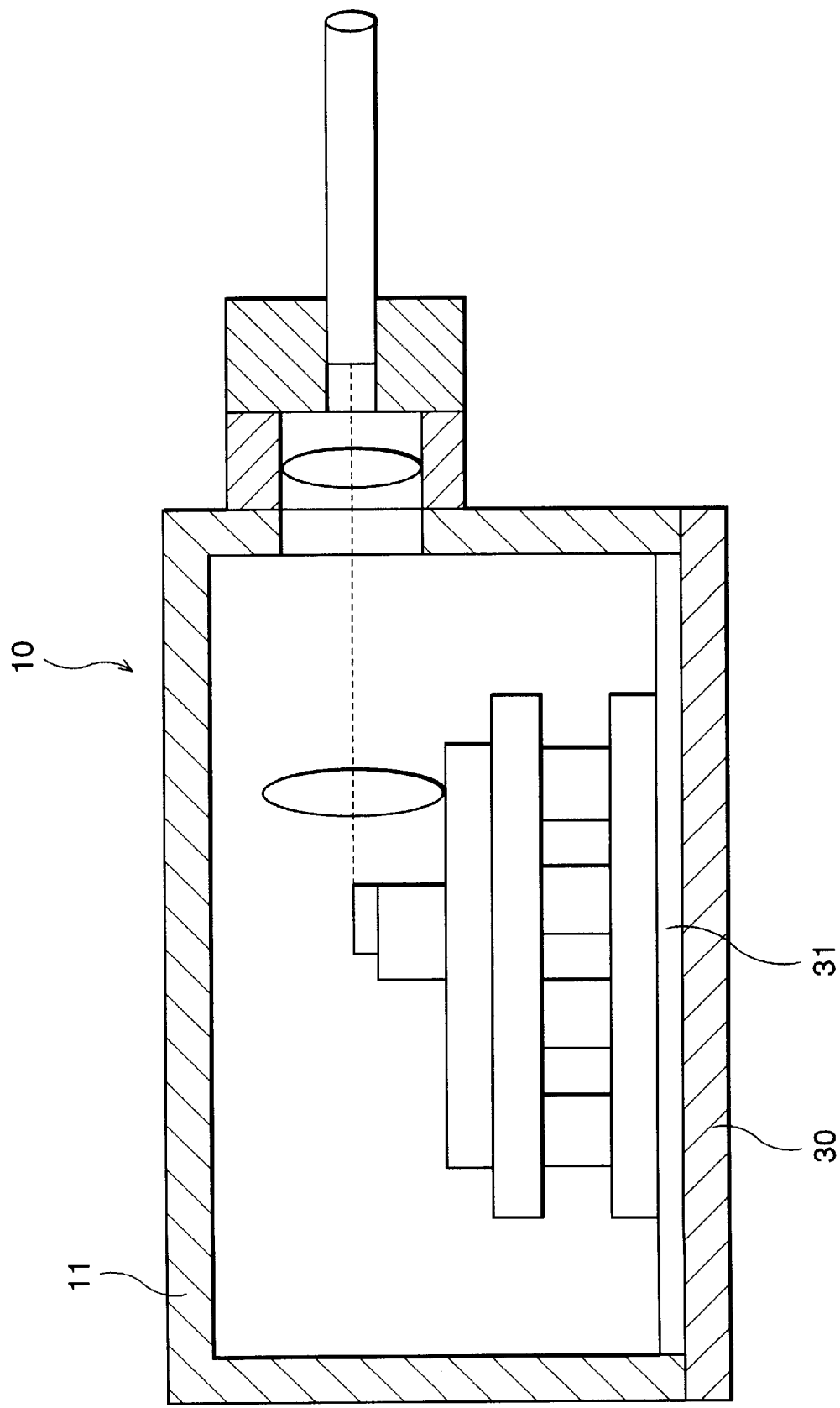
FIG. 3 is a schematic cross-sectional view of a semiconductor laser module in a modified embodiment according to the present invention.

FIG. 3 is a schematic cross-sectional view of a semiconductor laser module in a modified embodiment according to the present invention.

A semiconductor laser module 10 in this embodiment differs from the semiconductor laser module 10 in the first embodiment as follows. The inner base of a module package 11 consists of a highly heat conducting substrate 30. A welding substrate 31 is solder-fixed by using AgCu to the highly heat conducting substrate 30. A second ceramic substrate 21b of a welding substrate part 12b is fixed to the welding substrate 31 by means of YAG laser welding.

In this embodiment, the highly heat conducting substrate 30 is made of CuW and the welding substrate 31 is made of FeNiCo alloy.

In this arrangement, CuW having higher heat conductivity than FeNiCo alloy is used for the base of the module package 11 which functions to transfer heat emitted from the second ceramic substrate 21b to the outside of the module 10. As a result, the heat is emitted to the outside of the module package 11 effectively and the cooling performance of the module 10 can be thereby improved. Needless to say, they can be made of other materials having high heat conductivity.

Figure 4:
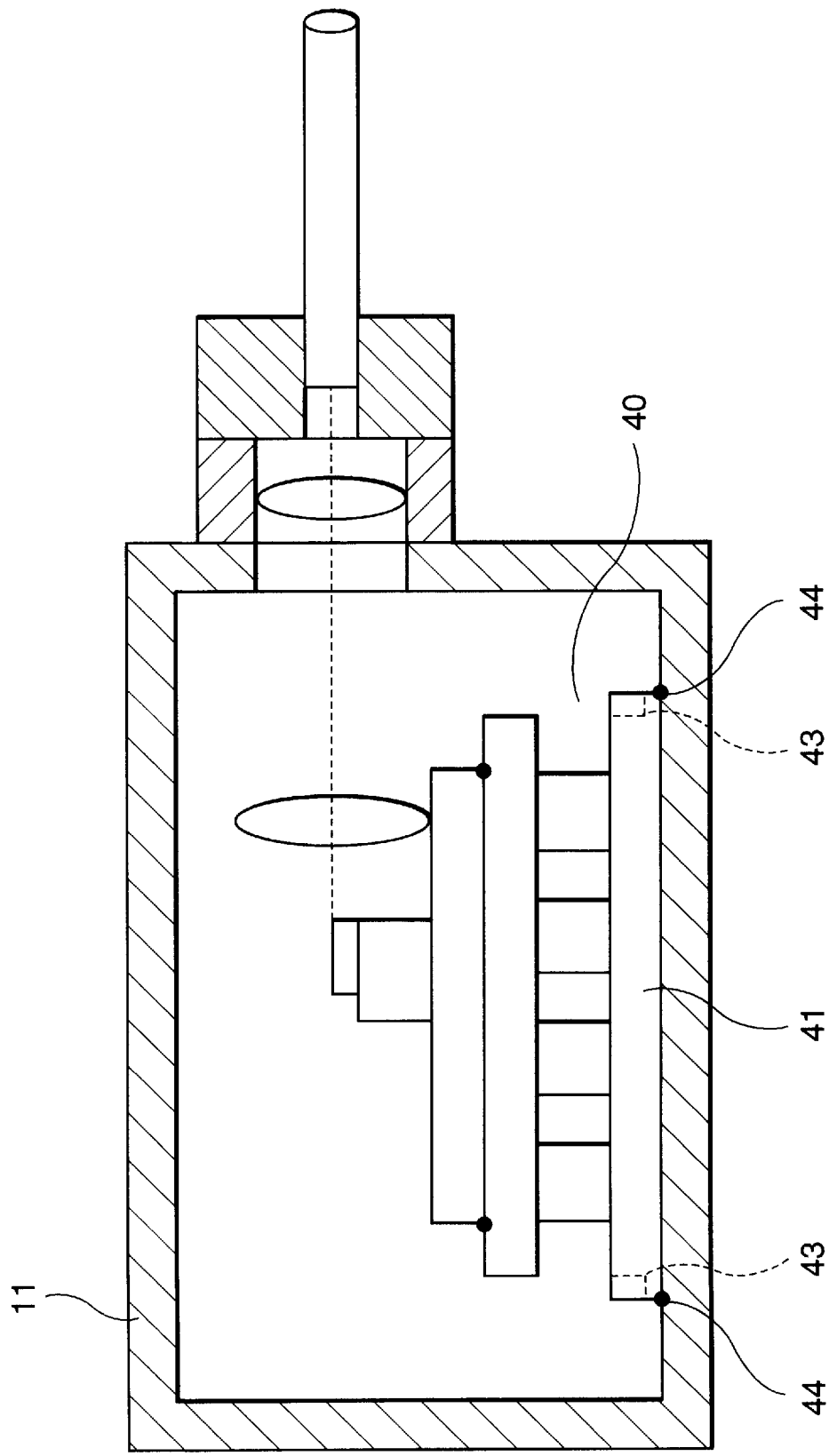
FIG. 4 is a schematic cross-sectional view of a semiconductor laser module in another modified embodiment according to the present invention.

FIG. 4 is a schematic cross-sectional view of a semiconductor laser module in another embodiment according to the present invention.

A semiconductor laser module 10 in this embodiment differs from the semiconductor laser module 10 in the first embodiment as follows. In this embodiment, the Peltier cooler 12 in the first embodiment is replaced with a Peltier cooler 40. In addition, the Peltier cooler 40 in this embodiment includes a high temperature side substrate part 41 instead of the high temperature side substrate part 12b of the Peltier cooler 12 in the first embodiment.

Figure 5:
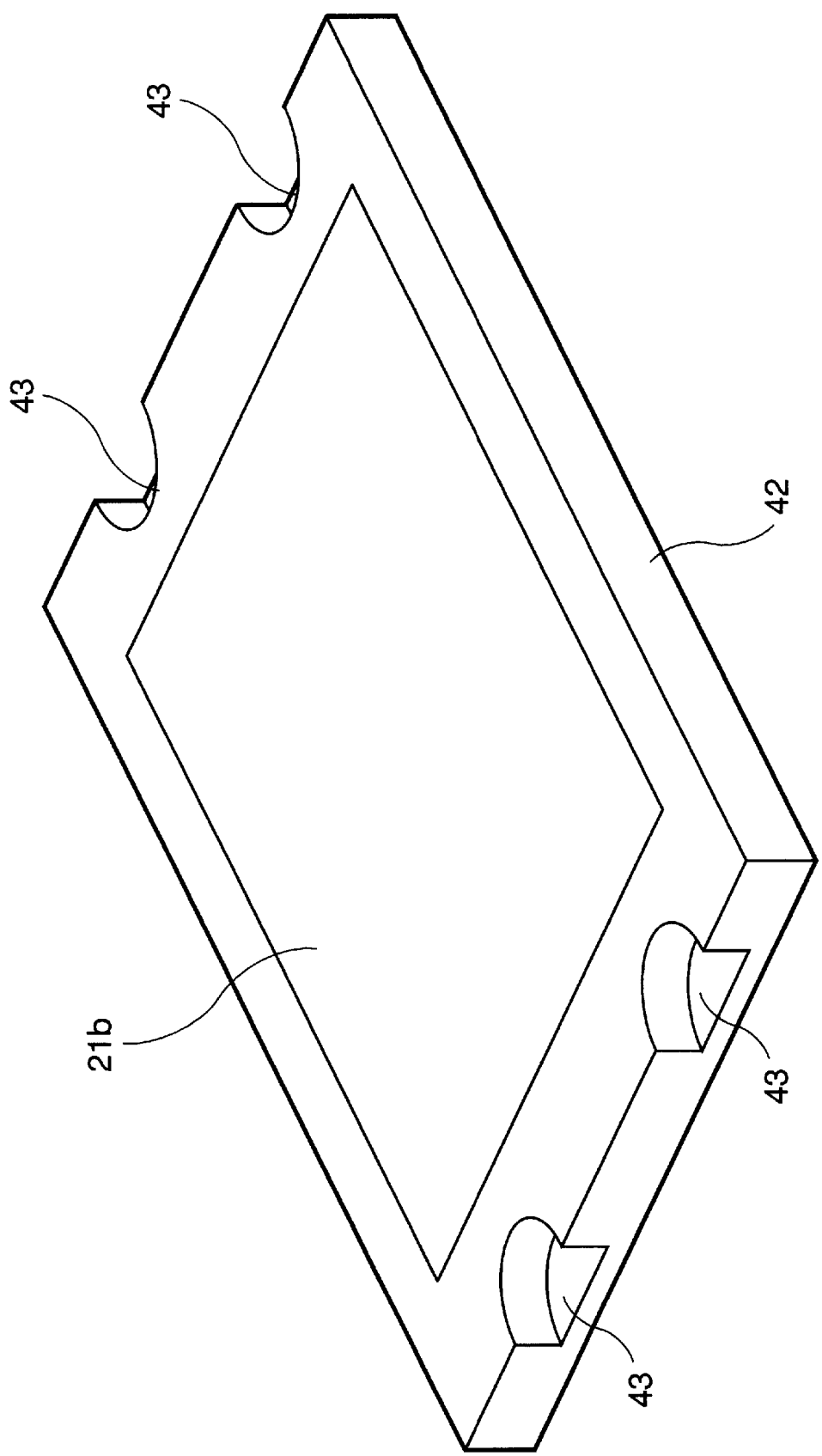
FIG. 5 is a perspective view of a high temperature side substrate part of a Peltier cooler of the semiconductor laser module of FIG. 4.

FIG. 5 is a perspective view of the high temperature side substrate part 41.

Specifically, a second metal frame 42 is solder-fixed on the outer periphery of a second ceramic substrate 21b. Thin through weld parts 43 are formed by cutting upper surface portions of ends of the second metal frame 42 to be of semicircular shape. The through weld parts 43 are made thinner than that of the second metal frame 42 so that incident laser beam can pass through the weld parts 43.

The second metal frame 42 and the inner base of the module package 11 are fixed to each other at a weld part 44 shown in FIG. 4 by means of YAG laser welding. During welding, YAG laser beam is incident on the through weld parts 43 and passes therethrough to melt the inner base of the module package 11.

For example, if the Peltier cooler 12 in the first embodiment is fixed to the module package 11 by YAG laser welding, the side surface of the second metal frame 22b and the inner base of the module package 11 are molten by the laser beam. Thus, the YAG beam needs to be radiated in a slant direction relative to the perpendicular direction.

In that case, the dimension of the module package 11 needs to have an allowance so that the YAG laser beam is not incident on the side surface of the module package 11 and the like. In this embodiment, by contrast, if the Peltier cooler 40 is fixed, laser beam is radiated in the perpendicular direction. Therefore, there is no need to add an allowance to the module package 11, thereby making it possible to provide a smaller dimension.

As described above, the Peltier cooler 12 has a Pertier device 12c put between a low temperature side substrate part 12a made of insulating material and a high temperature side substrate part 12b made of insulating material. The first and second metal frames 22a and 22b are solder-fixed on the periphery of the insulating substrate parts 12a and 12b, respectively. Due to this, the first and second metal frames 22a and 22b can be fixed by means of laser welding with high precision in a stable manner. As a result, no solder creep occurs on the semiconductor laser module, thereby ensuring the stable arrangement of the optical system for a long time.

What is claimed is:

1. A Peltier cooler having a Peltier device disposed between two insulating boards, wherein a metal frame is fixed to each of said insulating boards and said metal frame is fixed on the outer periphery of each of said insulating boards.

2. A semiconductor laser module comprising:

a semiconductor laser and an optical component which are mounted on a carrier substrate;

a Peltier cooler having a Peltier device disposed between upper and lower insulating boards and having a metal frame fixed to each of the upper and lower insulating boards; and a module package fixing said carrier substrate to the upper metal frame of said Peltier cooler, fixing the lower metal frame of the Peltier cooler on an inner base of the module package and conducting oscillation light from the laser module to an outside of the module package;

wherein said metal frame is fixed on the outer periphery of each of the upper and lower insulating boards.

* * * * *